United States Patent
Tu et al.

(10) Patent No.: US 8,536,597 B2
(45) Date of Patent: Sep. 17, 2013

(54) LIGHT EMITTING DIODE WITH PERIPHERAL CIRCULAR SLOTS AND METHOD FOR MANUFACTURING THE SAME

(75) Inventors: Po-Min Tu, Hsinchu (TW); Shih-Cheng Huang, Hsinchu (TW); Shun-Kuei Yang, Hsinchu (TW); Chia-Hung Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 118 days.

(21) Appl. No.: 13/214,254

(22) Filed: Aug. 22, 2011

(65) Prior Publication Data

US 2012/0097976 A1   Apr. 26, 2012

(51) Int. Cl.
*H01L 33/14* (2010.01)
*H01L 33/18* (2010.01)

(52) U.S. Cl.
USPC .. 257/95; 257/98; 257/E33.068; 257/E33.011

(58) Field of Classification Search
None
See application file for complete search history.

(56) References Cited

U.S. PATENT DOCUMENTS

2009/0026476 A1 * 1/2009 Tazima et al. .................. 257/98

OTHER PUBLICATIONS

"The New Horizon is Vertical in HB-LEDs. Excimer Lasers Excel in Sapphire Substrate Removal" downloaded from URL <http://web.archive.org/web/20111006155606/http://coherent.com/Downloads/HB_LED.pdf> on Feb. 14, 2013.*
Wayback Machine Report for URL <http://www.coherent.com/Downloads/HB_LED.pdf>.*
Chu, Chen-Fu. "Study of GaN Light-emitting Diodes Fabricated by Laser Lift-off Technique." Journal of Applied Physics 95.8 (2004): 3916.*

* cited by examiner

*Primary Examiner* — Thomas L Dickey
*Assistant Examiner* — Joseph Schoenholtz
(74) *Attorney, Agent, or Firm* — Altis & Wispro Law Group, Inc.

(57) ABSTRACT

A light emitting diode chip includes an electrically conductive substrate, a reflecting layer disposed on the substrate, a semiconductor structure formed on the reflecting layer, an electrode disposed on the semiconductor structure, and a plurality of slots extending through the semiconductor structure. The semiconductor structure includes a P-type semiconductor layer formed on the reflecting layer, a light-emitting layer formed on the P-type semiconductor layer, and an N-type semiconductor layer formed on the light-emitting layer. A current diffusing region is defined in the semiconductor structure and around the electrode. The slots are located outside the current diffusing region.

4 Claims, 3 Drawing Sheets

LIGHT EMITTING DIODE WITH PERIPHERAL CIRCULAR SLOTS AND METHOD FOR MANUFACTURING THE SAME

TECHNICAL FIELD

The disclosure relates generally to semiconductor devices, and more particularly to an LED (light emitting diode) chip and a method for manufacturing the same.

DESCRIPTION OF THE RELATED ART

In recent years, LEDs (light emitting diodes) have become more and more popular, due to their low power-consumption, energy saving properties, high efficiency, short reactive time and long life. Furthermore the LEDs contain no mercury. LED chips are classified into vertical type and lateral type, based on locations of electrodes of the LED chips.

A typical vertical LED chip includes an electric substrate, a P-type semiconductor layer, a light-emitting layer, an N-type semiconductor layer and an electrode in sequence. Generally, a thermal expansion coefficient of the electric substrate is different from that of the P-type semiconductor, so it is too difficult to form a current diffusing layer on the N-type semiconductor layer by means of high-temperature temper. Therefore, when the LED chip works, a predetermined current transfer region is defined around the electrode, and current hardly flows to a periphery portion outside the current transfer region of the LED chip, so the periphery portion can not emit light, which results in a low light-emitting efficiency of the LED chip.

Therefore, it is desirable to provide an LED chip which can overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present light emitting diode chip for microminiaturization. Moreover, in the drawings, like reference numerals designate corresponding parts throughout the whole views.

DETAILED DESCRIPTION

Reference will now be made to the drawings to describe the exemplary embodiments in detail.

Figure 1:
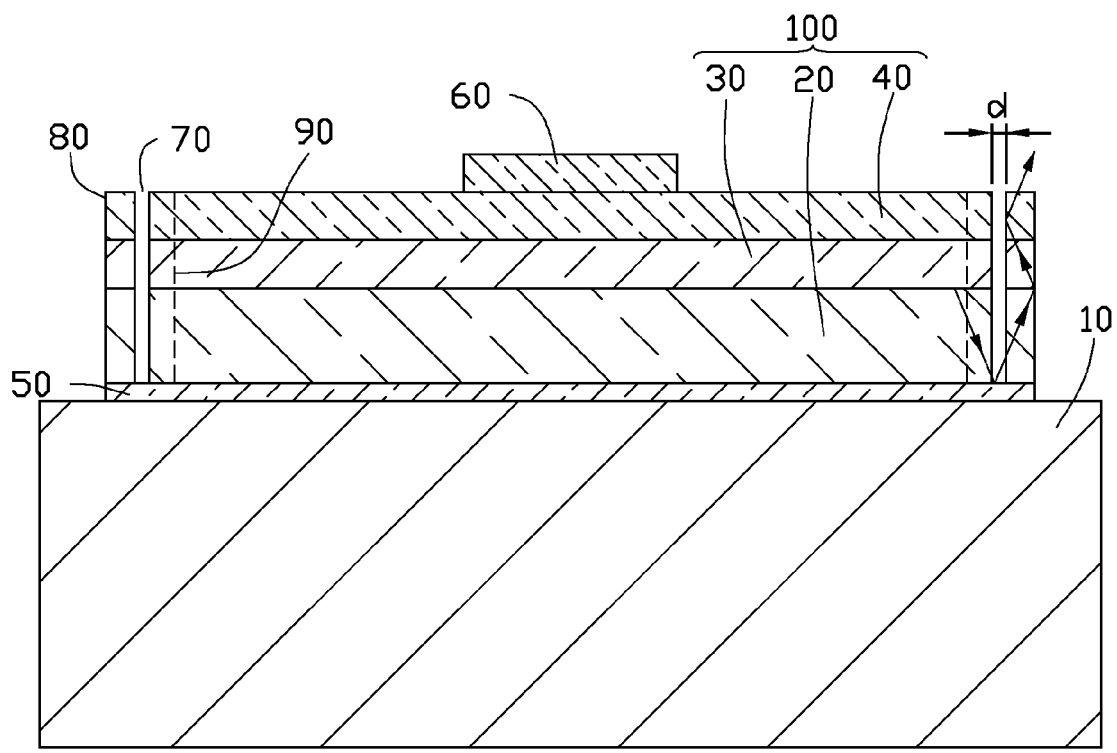
FIG. 1 is a schematic, cross-sectional view of an LED chip according to an exemplary embodiment of the present disclosure.

Referring to FIG. 1, an LED chip in accordance with an exemplary embodiment of the present disclosure is illustrated. The LED chip comprises an electric substrate 10, a reflecting layer 50 formed on the substrate 10, a semiconductor structure 100 disposed on the reflecting layer 50, and an electrode 60 disposed on the semiconductor structure 100. In the present embodiment of the disclosure, the electrode 60 is located at a center of a top face of the semiconductor structure 100.

The semiconductor structure 100 comprises a P-type semiconductor layer 20 located on the reflecting layer 50, a light-emitting layer 30 formed on the P-type semiconductor layer 20, and an N-type semiconductor layer 40 formed on the light-emitting layer 30. In the embodiment of the disclosure, the LED chip is a vertical ultraviolet LED chip, and a current diffusing region 90 thereof is shown by the broken line of FIG. 2, which is around the electrode 60 and within a periphery of the semiconductor structure 100. That is, there is nearly no current in the peripheral region of the semiconductor structure 100 outside the current diffusing region 90.

The substrate 10 is made of GaN, SiC, Si, Cu, CuW, or other suitable electrically conductive materials.

In the embodiment of the disclosure, the N-type semiconductor layer 40 is made of GaN or AlGaN, preferably made of AlGaN. The P-type semiconductor layer 20 is made of GaN.

The reflecting layer 50 is made of Al, Ag, Au, Ni, or an alloy thereof.

Figure 2:
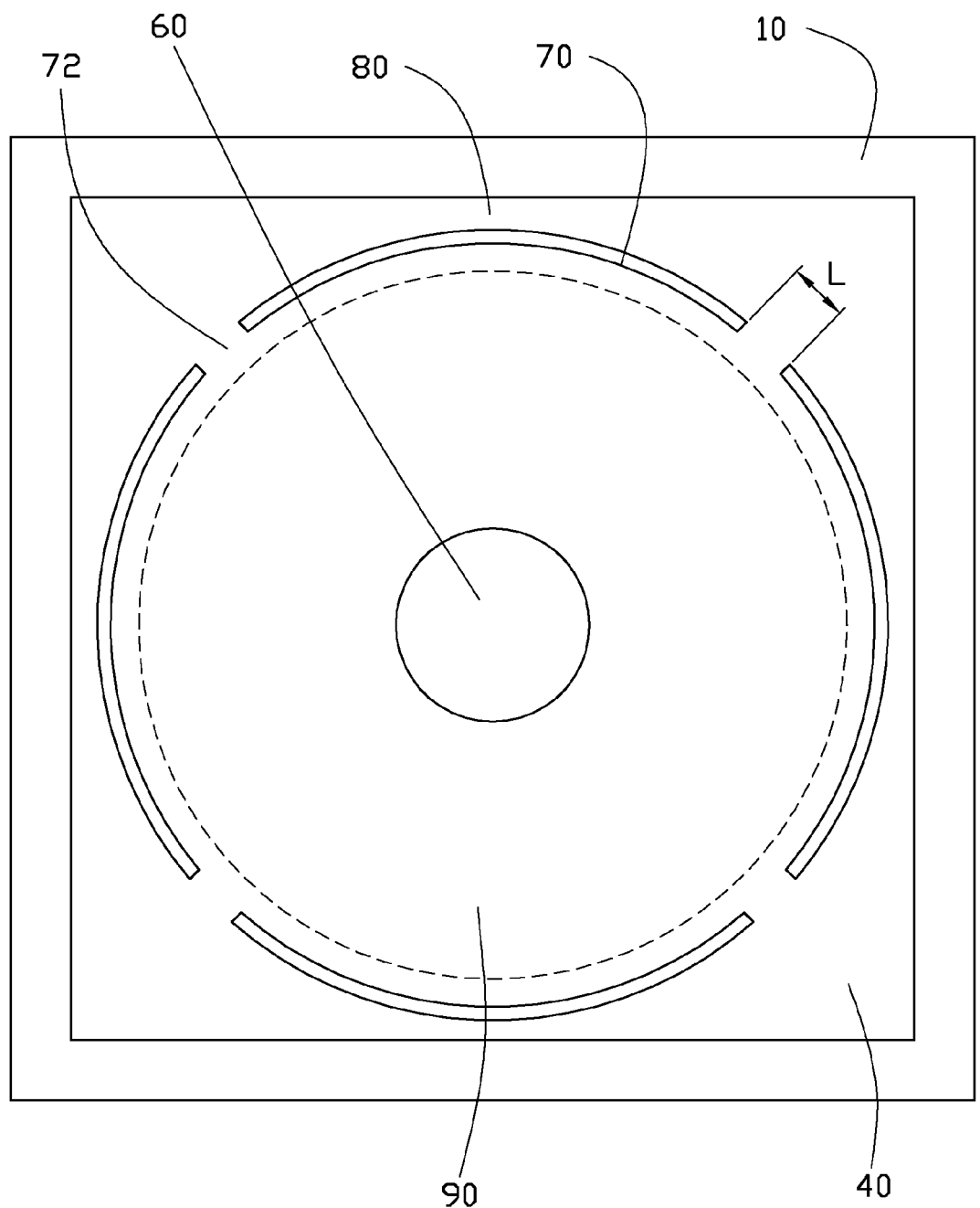
FIG. 2 is a top view of the LED chip of FIG. 1.

Referring to FIG. 2 also, a plurality of slots 70 are defined in the periphery of the semiconductor structure 100 beyond the current diffusing region 90. The slots 70 extend upright though the semiconductor structure 100 from the top of reflecting layer 50 to a topside of the semiconductor structure 100. The slots 70 are located on an imaginary circle which is coaxial with the electrode 60. The slots 70 are spaced from each other and evenly arranged along the imaginary circle, with a bridge 72 defined between every two adjacent slots 70. In this embodiment, the slots 70 have a number of four. Two adjacent slots 70 are apart from each other with a predetermined distance L. Each slot 70 has a predetermined width d. In the present embodiment of the disclosure, a length and a width of the LED chip are both about 300 μm, the distance L is preferably in a range from 10 μm to 50 μm, and the width d is preferably in a range from 1 μm to 20 μm. It can be understood that, the slots 70 could extend along another imaginary geometry, such as an imaginary rectangle or an imaginary ellipse.

A peripheral part of the semiconductor structure 100 outside the imaginary circle defined by the slots 70 functions as a light transition portion 80. The light transition portion 80 electrically connects with an inner part of the semiconductor structure 100 inside the imaginary circle via the bridges 72. As shown in FIG. 1, light emitted from a lateral side of the light-emitting layer 30 in the inner part of the semiconductor structure 100 is reflected by the reflecting layer 50 to the light transition portion 80, and transmitted in the light transition portion 80 towards the topside of the LED chip to leave the LED chip. Therefore, a light-emitting efficiency of the LED chip is enhanced.

Figure 3:
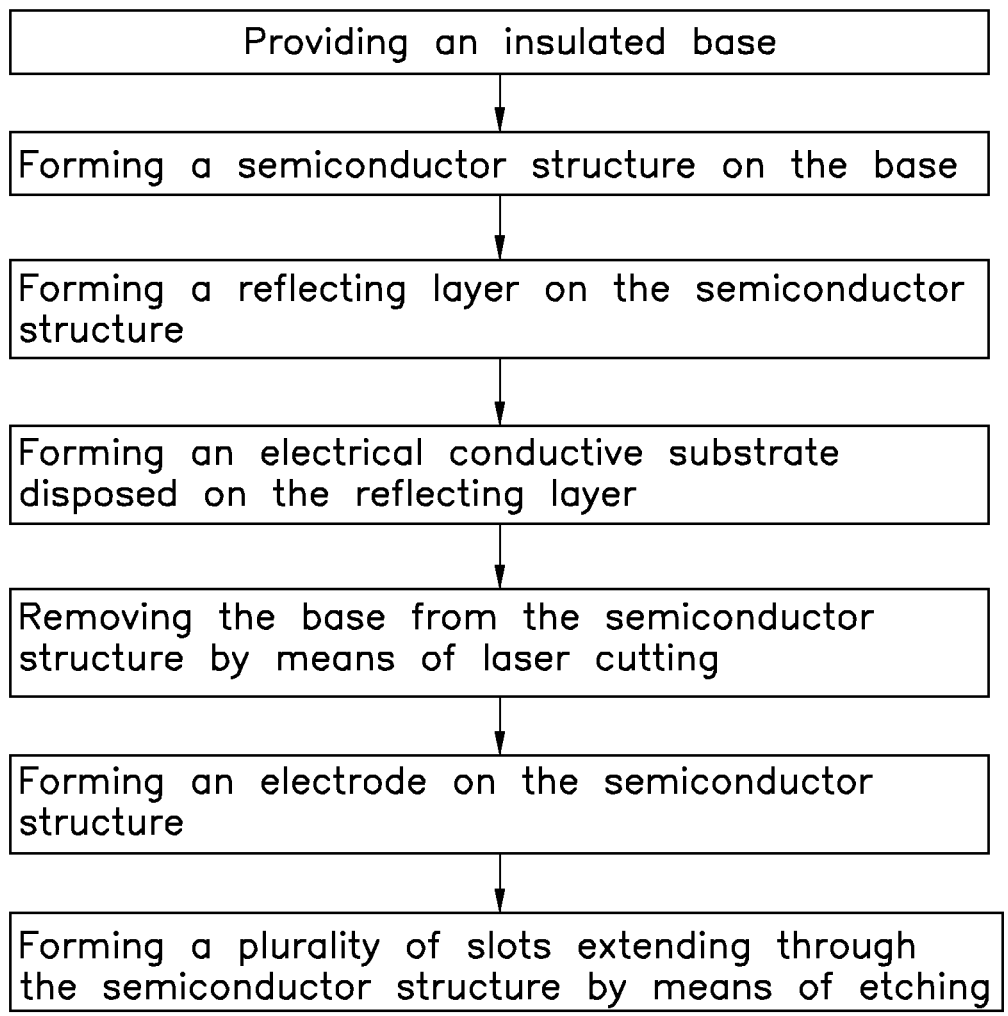
FIG. 3 is a flow chart showing a method for manufacturing the LED chip of the disclosure.

Referring to FIG. 3, the present disclosure provides a method for manufacturing a light emitting diode chip which comprises the following steps:

Firstly, an insulated base is provided with a semiconductor structure 100 formed on the base. The semiconductor structure 100 comprises an N-type semiconductor layer 40 on the base, a light-emitting layer 30 on the N-type semiconductor layer 40, and a P-type semiconductor layer 20 on the light-emitting layer 30.

Then, a reflecting layer 50 is formed on the P-type semiconductor layer 20 of the semiconductor structure 100 by means of evaporating.

Then, an electrically conductive substrate 10 is fixed on the reflecting layer 50 by means of electroplating or wafer bonding.

Then, the base is removed from the N-type semiconductor layer 40 by means of laser lift-off.

Then, an electrode 60 is formed on the N-type semiconductor layer 40 by means of evaporating.

Finally, a plurality of spaced slots 70 are formed in the semiconductor structure 100 by means of etching. The slots 70 are located outside a predetermined current diffusing region 90, which is defined around the electrode 60. The slots 70 extend though the semiconductor structure 100. The slots 70 extend along an imaginary circle around the electrode 60. Thus, the semiconductor structure 100 has a periphery part outside the imaginary circle defined by the slots 70 which forms a light transition portion 80, and an inner part inside the imaginary circle.

It is to be understood, however, that even though multiple characteristics and advantages of the disclosure have been set forth in the foregoing description, together with details of the structure and function of the invention disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A light emitting diode chip, comprising:
   an electrically conductive substrate;
   a reflecting layer disposed on the substrate;
   a semiconductor structure formed on the reflecting layer, and the semiconductor structure comprising a P-type semiconductor layer formed on the reflecting layer, a light-emitting layer formed on the P-type semiconductor layer, and an N-type semiconductor layer formed on the light-emitting layer;
   an electrode disposed on the semiconductor structure, and a current diffusing region defined in the semiconductor structure and around the electrode; and
   a plurality of slots extending through the semiconductor structure, surrounding the electrode and located outside the current diffusing region;
   wherein the semiconductor structure has a periphery part thereof outside the slots forming a light transition portion surrounding the slots;
   wherein the slots are spaced from each other;
   wherein the slots extend along an imaginary circle surrounding the electrode and having the electrode located at a center of the imaginary circle; and
   wherein the slots are spaced from each other with a bridge defined between every two adjacent slots, the bridges being located on the same imaginary circle along which the slots extend.

2. A method for manufacturing a light emitting diode chip, comprising following steps:
   providing a semiconductor structure comprising an N-type semiconductor layer, a light-emitting layer on the N-type semiconductor layer, and a P-type semiconductor layer on the light-emitting layer;
   forming a reflecting layer on the P-type semiconductor layer of the semiconductor structure;
   forming an electrically conductive substrate on the reflecting layer;
   forming an electrode on the N-type semiconductor layer, and a current diffusing region being defined in the semiconductor structure around the electrode; and
   forming a plurality of slots extending through the semiconductor structure and located outside the current diffusing region, wherein the semiconductor structure forms a light transition portion surrounding the slots;
   wherein the slots are defined in the semiconductor structure by means of etching;
   wherein the slots are spaced from each other with a bridge defined between every two adjacent slots; and
   wherein the slots extend along an imaginary circle surrounding the electrode, the bridges being located on the same imaginary circle.

3. A light emitting diode chip, comprising:
   an electrically conductive substrate;
   a reflecting layer disposed on the substrate;
   a semiconductor structure formed on the reflecting layer, and the semiconductor structure comprising a P-type semiconductor layer formed on the reflecting layer, a light-emitting layer formed on the P-type semiconductor layer, and an N-type semiconductor layer formed on the light-emitting layer;
   an electrode disposed on the semiconductor structure, and a current diffusing region defined in the semiconductor structure and around the electrode; and
   a plurality of slots extending through the semiconductor structure and along an imaginary circle, the slots surrounding the electrode and located outside the current diffusing region, the slots being spaced from each other with a bridge formed between every two adjacent slots, the bridges being located on the same imaginary circle where the slots extend.

4. The light emitting diode chip as claimed in claim 3, wherein Each of the slots has a width in a range from 1 µm to 20 µm.

* * * * *